United States Patent
Wristers et al.

(10) Patent No.: US 6,406,964 B1
(45) Date of Patent: Jun. 18, 2002

(54) METHOD OF CONTROLLING JUNCTION RECESSES IN A SEMICONDUCTOR DEVICE

(75) Inventors: Derick J. Wristers, Austin; Jon D. Cheek, Round Rock; John G. Pellerin, Austin, all of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/704,008

(22) Filed: Nov. 1, 2000

(51) Int. Cl.$^7$ .................. H01L 21/336; H01L 21/44
(52) U.S. Cl. .................. 438/305; 438/303; 438/308; 438/571
(58) Field of Search .................. 438/303, 305, 438/231, 291, 217, 306, 308, 571; 257/345, 346, 344, 355, 336

(56) References Cited

U.S. PATENT DOCUMENTS

| | | | | |
|---|---|---|---|---|
| 5,223,445 A | * | 6/1993 | Fuse | 437/24 |
| 5,286,665 A | * | 2/1994 | Muragishi et al. | 437/44 |
| 5,372,957 A | * | 12/1994 | Laing et al. | 437/35 |
| 5,449,937 A | * | 9/1995 | Arimura et al. | 257/345 |
| 5,516,707 A | * | 5/1996 | Loh et al. | 437/24 |
| 5,759,901 A | * | 6/1998 | Loh et al. | 438/305 |
| 5,977,600 A | | 11/1999 | Wristers et al. | 257/408 |
| 6,018,180 A | | 1/2000 | Cheek et al. | 257/344 |
| 6,218,226 B1 | * | 4/2001 | Lin et al. | 438/200 |
| 6,232,192 B1 | * | 5/2001 | Yamakawa et al. | 438/303 |
| 6,255,174 B1 | * | 7/2001 | Yu | 438/286 |
| 6,258,680 B1 | * | 7/2001 | Fulford, Jr. et al. | 438/305 |
| 6,286,640 B1 | * | 7/2001 | Park et al. | 257/667 |
| 6,277,682 B1 | * | 8/2001 | Misium | 438/189 |
| 6,287,925 B1 | * | 9/2001 | Yu | 438/301 |

FOREIGN PATENT DOCUMENTS

| | | | |
|---|---|---|---|
| EP | 0 333 132 | 9/1989 | H01L/23/50 |
| WO | WO 98/00862 | 1/1998 | H01L/21/768 |

OTHER PUBLICATIONS

Wolf, Stanley "Silicon Processing For the VLSI Era vol. III: The Submicron MOSFET", Lattic Press, 1995, pp. 630–634.*

* cited by examiner

Primary Examiner—Michael S. Lebentritt
(74) Attorney, Agent, or Firm—Williams, Morgan & Amerson, P.C.

(57) ABSTRACT

The present invention is directed to a method of forming a transistor. In one embodiment, the method comprises providing a substrate, the substrate being doped with a first type of dopant material, forming a transistor above the substrate in an active area of the substrate as defined by an isolation structure, and performing at least one ion implant process to implant dopant atoms in the substrate adjacent the gate electrode of the transistor. The method further comprises performing at least two angled ion implant processes on the transistor with a dopant material that is of an opposite type to the first type of dopant material and performing at least one anneal process.

40 Claims, 3 Drawing Sheets

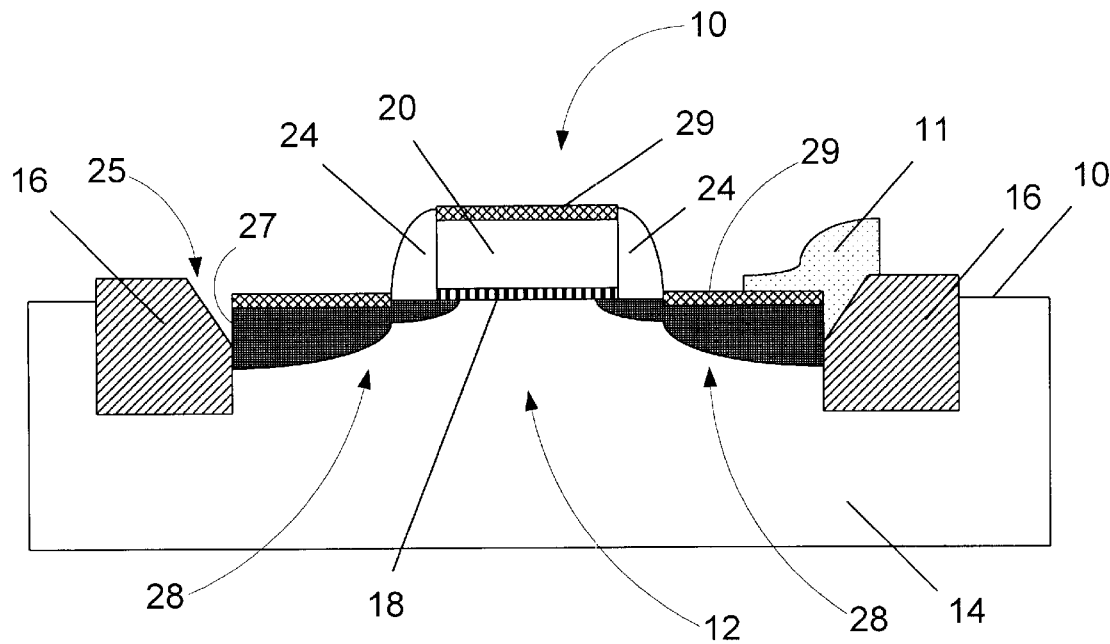
(Prior Art) Figure 1
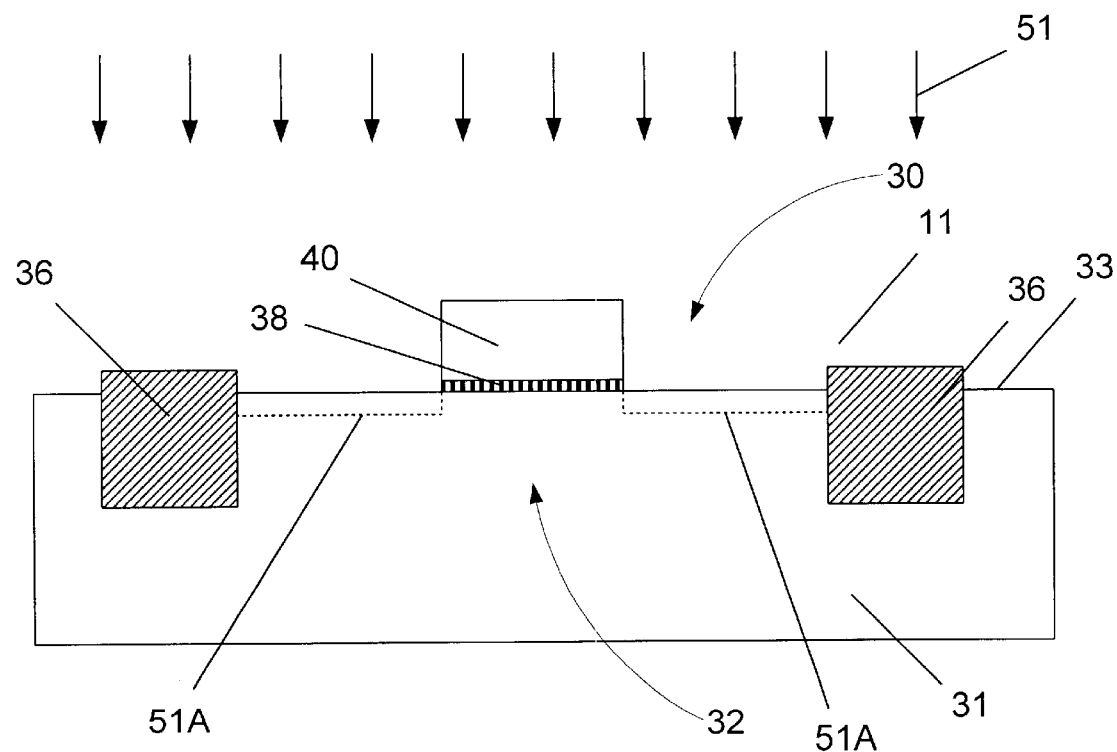
Figure 2

METHOD OF CONTROLLING JUNCTION RECESSES IN A SEMICONDUCTOR DEVICE

BACKGROUND OF THE INVENTION

1. Field of the Invention

The present invention is generally directed to semiconductor processing, and, more particularly, to a method of controlling junction recesses in a semiconductor device.

2. Description of the Related Art

There is a constant drive within the semiconductor industry to increase the operating speed of integrated circuit devices, e.g., microprocessors, memory devices, etc. This drive is fueled by consumer demands for computers and electronic devices that operate at increasingly greater speeds. This demand for increased speed has resulted in a continual reduction in the size of semiconductor devices, e.g., transistors. That is, the size of many components of a typical field effect transistor, e.g., channel length, source/drain junction depths, gate dielectric thickness, etc., are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

Modern integrated circuit devices are comprised of millions of transistors formed above a semiconducting substrate. In order to perform their intended function, the various semiconductor devices, e.g., transistors, must be electrically coupled to one another. In most modern integrated circuit devices this is accomplished by forming a plurality of conductive interconnections, i.e., conductive lines and conductive plugs, above the substrate. Typically, these conductive lines and conductive plugs are formed in alternating layers above the substrate. Such conductive interconnections allow signals to propagate throughout the integrated circuit device thereby enabling the device to perform its intended function.

By way of background, FIG. 1 depicts an illustrative transistor 10 for purposes of explaining one or more problems that may be solved or reduced by the present invention. As shown in FIG. 1, the transistor 10 is formed in an active area 12 that is defined in the semiconducting substrate 14 by isolation structures 16 formed therein. The transistor 10 is comprised of a gate insulation layer 18, a gate electrode 20, a sidewall spacer 24, and a plurality of source/drain regions 28. The transistor 10 is also comprised of metal silicide layers 29 formed above the source/drain regions 28 and the gate electrode 20. All of the various components of the transistor 10 depicted in FIG. 1 may be formed using a variety of known processing techniques and they may be comprised of a variety of materials. For example, the gate insulation layer 18 may be comprised of a thermally grown layer of silicon dioxide, the gate electrode 20 may be comprised of polysilicon, the sidewall spacer 24 may be comprised of silicon dioxide, and the metal silicide regions 29 may be comprised of, for example, cobalt silicide or titanium silicide.

Also depicted in FIG. 1 is a conductive interconnection 11 formed above one of the source/drain regions 28 of the transistor 10. Please note that, for purposes of clarity and explanation, only one such conductive interconnection 11 is depicted in FIG. 1, although such a conductive interconnection will be applied to both of the source/drain regions 28, as well as the gate electrode 20. The conductive interconnection 11 may take a variety of forms, e.g., a strap that would extend over the isolation region 16 to connect to another source/drain region (not shown) of a separate transistor (not shown). Alternatively, the conductive interconnection 11 may extend vertically upward to additional conductive interconnections, e.g., a conductive line formed on the integrated circuit device. Moreover, the conductive interconnection 11 may take a variety of shapes or forms, e.g., straps or generally cylindrical contacts, that may have an oval or circular cross-sectional configuration when viewed from above, etc.

The isolation structure 16 is typically comprised of an insulating material, such as silicon dioxide, or other like material. The isolation structure 16 may be constructed by forming a trench in the substrate 14, filling the trench with an appropriate insulating material, e.g., silicon dioxide, and, thereafter, performing a chemical mechanical polishing operation to remove any excess material.

After the isolation structure 16 is formed, many additional processing steps must be performed to form the transistor 10. Those process steps, at times, tend to erode or consume portions of the isolation structure 16, particularly at the interface between the source/drain region 28 and the isolation structure 16, thereby resulting in the recess 25 depicted in FIG. 1. There are a vast variety of process steps that may cause erosion of the isolation structures 16. For example, the surface of the substrate 14 is frequently cleaned to remove native oxides, and the sidewall spacers 24 are formed by depositing a layer of material, e.g., silicon dioxide, and, thereafter, performing an etching process, etc. Of course, as those skilled in the art will recognize, the recess 25 depicted in FIG. 1 is only schematic in nature, i.e., any such recess may take a variety of shapes. The depth and extent of the recess 25 may also vary.

Undesirable consumption of the isolation structure may also occur when conductive interconnections, such as the conductive interconnection 11, are formed above the source/drain regions 28. In some situations, the conductive interconnection 11 would ideally be positioned entirely over the source/drain region 28, i.e., it will be located between the isolation structure 16 and the sidewall spacer 24. Such a conductive interconnection, such as a generally cylindrical conductive contact (not shown), may be formed by forming a layer of insulating material, and, thereafter, performing one or more etching processes to define an opening in the insulating layer where the conductive contact will be formed. However, in situations where the opening in the insulating layer is misaligned, i.e., where the opening extends over a portion of the isolation structure 16, the isolation structure 16 may be subjected to the etching process that is used to form the opening in the insulation layer.

As a result of all of these various process steps, portions of the isolation structure 16 may be consumed or eroded away to form the recess 25 that exposes a portion of the sidewall 27 of the source/drain region 28. This recess 25 allows the conductive interconnection 11 to be formed on the exposed surface 27 of the source/drain region 28, thereby effectively reducing the junction depth of the device in that local area. As a result, the device may exhibit increased off-state leakage currents and increased power consumption, both of which are undesirable characteristics in modern integrated circuit devices.

The present invention is directed to a method that solves or reduces some or all of the aforementioned problems.

SUMMARY OF THE INVENTION

The present invention is directed to a method of forming a transistor. In one illustrative embodiment, the method comprises providing a substrate that is doped with a first type of dopant material, forming a transistor above the substrate in an active area of the substrate as defined by an isolation structure, and performing at least one ion implantation process to implant dopant atoms in the substrate adjacent the gate electrode of the transistor. The method further comprises performing at least two angled ion implant processes on the transistor with a dopant material that is of an opposite type to the first type of dopant material and performing at least one anneal process.

BRIEF DESCRIPTION OF THE DRAWINGS

The invention may be understood by reference to the following description taken in conjunction with the accompanying drawings, in which like reference numerals identify like elements, and in which:

FIG. 1 depicts an illustrative prior art transistor;

FIG. 2 depicts a partially formed semiconductor device wherein an ion implantation process is performed to form the source/drain extensions of the device;

Figure 3:
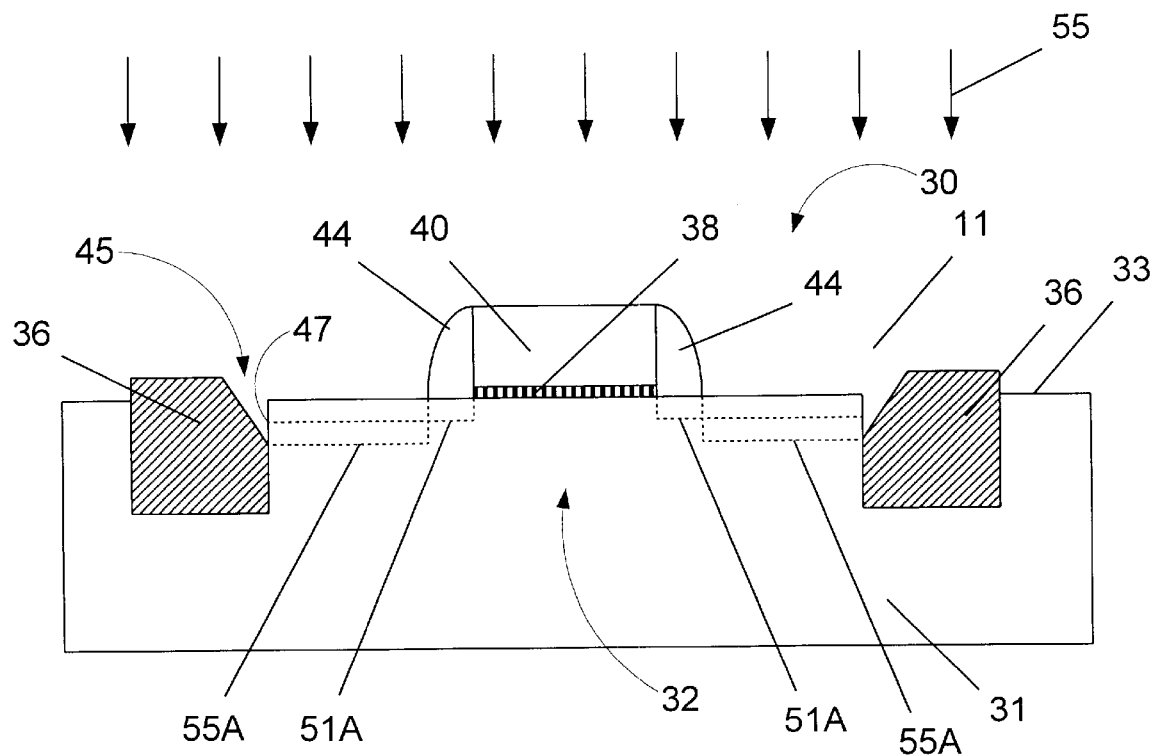
FIG. 3 depicts the device of FIG. 2 after a sidewall spacer has been formed adjacent the gate electrode of the device and a source/drain implant process has been performed on the device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–5. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those features or regions on fabricated devices. Nevertheless, the attached drawings are included to describe and explain illustrative examples of the present invention. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

In general, the present invention is directed to a method of controlling junction recess problems in semiconductor devices adjacent the interface between the source/drain region and the isolation structure using an angled ion implantation process. This angled ion implantation process will be performed using a doping material that is of the same type, e.g., N-type or P-type, as that of the source/drain regions for the device. That is, the angled implant process disclosed herein will be performed using a dopant material that is of a type opposite the nominal substrate doping, or well doping for CMOS devices. One illustrative process flow in which the present invention may be used is described below. As will become clear to those skilled in the art upon a complete reading of the present application, the present invention may be used in a vast variety of process flow schemes. Thus, the particular details of the process flow described herein should not be considered a limitation of the present invention unless such details are specifically set forth in the appended claims.

FIG. 2 depicts a partially formed semiconductor device 30 comprised of a gate electrode 40 and gate insulation layer 38. In general, the particular materials and techniques used to form the various components or layers of the transistor 30 depicted in FIG. 2, e.g., the gate insulation layer 38 and the gate electrode 40, are matters of design choice, and, thus, should not be considered a limitation of the present invention. For example, the gate insulation layer 38 may be comprised of silicon dioxide, and it may be formed by, for example, a thermal growth process or a deposition process. Similarly, the gate electrode 40 may be comprised of polysilicon, and it may be formed by, for example, a physical vapor deposition ("PVD") or a chemical vapor deposition ("CVD") process. In one illustrative embodiment, the gate electrode 40 is comprised of a layer of polysilicon having a thickness ranging from approximately 1000–3000 Å that is formed by a CVD process. The substrate 31 may be comprised of a variety of semiconducting materials, such as silicon, and it may be doped with 10 an N-type or a P-type dopant material.

One or more ion implantation processes may be performed using a dopant type that is opposite to that of the substrate to form source/drain regions for the device. For example, as indicated in FIG. 2, an ion implantation process, as indicated by arrows 51, may be performed on the device to form doped regions 51A in the semiconducting substrate 31 adjacent the gate electrode 40. This ion implantation process 51 is used to form the source/drain extensions of the completed device. This implantation process 51 is performed at a relatively low energy level and at a relatively high concentration of dopant atoms. For example, the concentration of dopant atoms in the ion implantation process 51 may vary from approximately $1 \times 10^{14}$ to $2$–$10^{15}$ ions/cm$^2$ of the appropriate dopant atoms, e.g., arsenic (Ar) or phosphorous (P) for NMOS technology, boron (B) or boron difluoride (BF$_2$) for PMOS technology, etc. The energy level for the ion implantation process 51 will vary depending upon the dopant material used in the process. For example, in one illustrative embodiment for forming the source/drain extension implants in an NMOS device, the ion implantation process 51 is performed using arsenic as the dopant atoms at a concentration ranging from approximately $1\times10^{14}$ to $2\times10^{15}$ ions/cm$^2$ and at an energy level ranging from approximately 2–20 keV. For a PMOS device, a small sidewall spacer (not shown) may be formed adjacent the gate electrode 40 prior to performing the implant step 51. This spacer is used in PMOS devices due to the increased diffusivity of the dopant atoms that may be implanted, e.g., boron.

Next, as indicated in FIG. 3, a sidewall spacer 44 is formed adjacent the gate electrode 40. The sidewall spacer 44 is formed by depositing a layer of spacer material above the surface of the device and thereafter performing an anisotropic etching process to define the spacer 44. The layer of spacer material may be comprised of a variety of materials, such as silicon dioxide, silicon oxynitride, or other like materials. Moreover, it may be formed by any of a variety of techniques for forming such layers, such as chemical vapor deposition (CVD), physical vapor deposition (PVD), etc.

Thereafter, as indicated in FIG. 3, an ion implantation process 55 is performed to form the doped regions 55A in the substrate adjacent the gate electrode 40. Note that the ion implantation process 55 is generally self-aligned with respect to the sidewall spacer 54. Moreover, the ion implantation process 55 is normally considered to be the source/drain implant in modern semiconductor manufacturing operations. For example, the concentration of dopant atoms in the ion implantation process 55 may vary from approximately $5\times10^{14}$ to $5\times10^{15}$ ions/cm$^2$ of the appropriate dopant atoms, e.g., arsenic or phosphorous for NMOS technology, boron for PMOS technology, etc. The energy level for the ion implantation process 55 will vary depending upon the dopant material. For example, in one illustrative embodiment for forming the source/drain regions in an NMOS device, the ion implantation process 55 is performed using arsenic as the dopant atoms at a concentration of approximately $5\times10^{14}$ to $5\times10^{15}$ ions/cm$^2$ and at an energy level ranging from approximately 40–70 keV.

Also note that the isolation structures 36 are depicted as having been eroded at this point in the process flow so as to result in a recess 45 in the isolation structure 36 adjacent what will become the source/drain region of the device. The extent and shape of the recess 45 will vary depending upon the materials of construction of the transistor 30, as well as the particular process flow used to construct the transistor 30.

Figure 4:
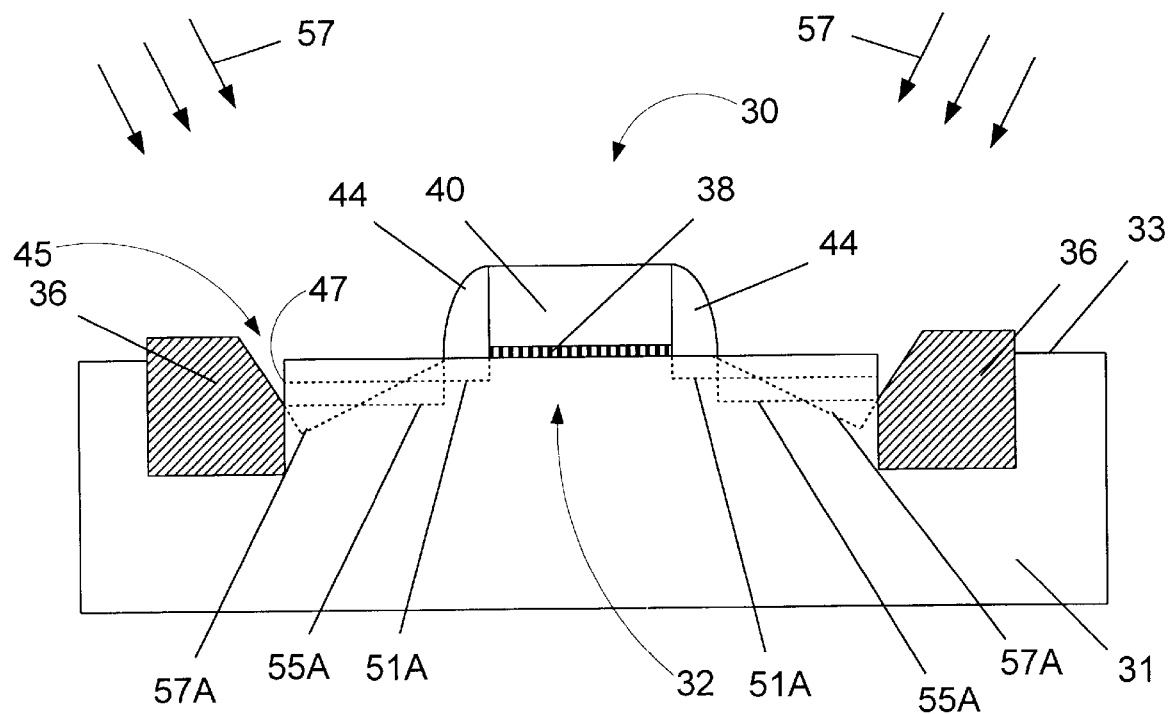
FIG. 4 depicts the device shown in FIG. 3 after at least two angled ion implant processes have been performed to form implanted regions adjacent the substrate/isolation structure interface.

Next, as shown in FIG. 4, after the formation of the sidewall spacer 44, the device is subjected to at least two angled ion implantation processes 57. The angled implant processes 57 may be performed either before or after the source/drain implant process 55. The implant processes 57 may be performed at an angle ranging from approximately 20–50 degrees with respect to a line perpendicular to the surface 33 of the substrate 31. The angled implant processes 57 may be performed using a variety of known implant tools useful for performing such operations. Moreover, the substrate 31 may be tilted at an angle with respect to a fixed source of ions in such a tool, or the source of the ions within the tool may be tilted at an angle with respect to a fixed substrate 31. The angled implant processes 57 result in the angled implant regions 57A indicated in FIG. 4. Note that, due to the erosion of the isolation structure 36, atoms implanted during the angled implant processes 57 are allowed to be implanted through the exposed sidewall 47 of the substrate 31. To the extent that there is no erosion of the isolation structure 36, the angled ion implant processes 57 are performed at such a concentration so as not to adversely impact the device performance.

When focusing on a single transistor 30, only two angled implant processes 57 need to be performed, i.e., once on each side of the transistor 30. However, as a practical matter, the device 30 may be subjected to four angled ion implant processes 57, each performed after the substrate has been rotated 90 degrees. This particular implant process flow, i.e., four implants spaced 90 degrees relative to one another, may be performed in situations, which are frequent, wherein many transistors formed above the substrate 31 are oriented 90 degrees relative to one another.

Each of the angled implant processes 57 may be performed at a concentration level ranging from approximately $5\times10^{13}$ to $1\times10^{15}$ ions/cm$^2$ of the appropriate dopant atoms, e.g., arsenic or phosphorous for NMOS technology, boron, boron difluoride for PMOS technology, etc. That is, the angled implant processes 57 are performed using a dopant material that is of a type opposite to the dopant material used to dope the substrate. The energy level for the angled ion implantation process 55 will vary depending upon the dopant material. For example, in one illustrative embodiment for forming the source/drain regions in an NMOS device, the ion implantation process 55 is performed using arsenic as the dopant atoms at a concentration of approximately $5\times10^{13}$ to $1\times10^{15}$ ions/cm$^2$ and at an energy level ranging from approximately 50–80 keV. For PMOS devices, boron difluoride may be implanted at approximately the same dopant concentration level and at an energy ranging from approximately 50–80 keV.

Figure 5:
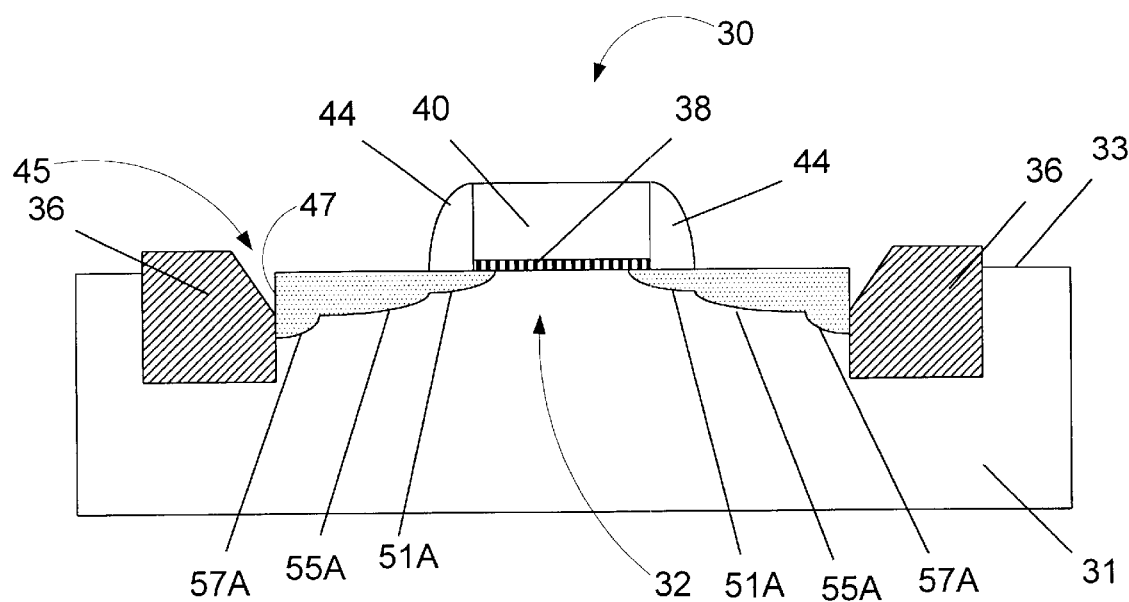
FIG. 5 depicts the device of FIG. 4 after it has been subjected to one or more anneal processes to activate the implanted dopant ions and to repair the damage to the lattice structure of the silicon substrate occasioned by the various implantation processes described above.

Next, as shown in FIG. 5, one or more thermal anneal processes is performed to activate the dopant atoms introduced into the substrate during various ion implantation processes described above, and to repair the damage to the lattice structure of the semiconducting substrate resulting from the ion implantation processes. In one embodiment, this anneal process may be at a temperature ranging from approximately 1000–1050° C. for a duration of approximately 5–20 seconds in a rapid thermal anneal chamber. Note that during this process, the previously implanted dopant atoms migrate, or move, from their original implanted position. This migration of the dopant atoms is generally isotropic in direction.

Although the various implant regions 51A, 55A and 57A are depicted in the drawings as having very precise and distinct boundaries, in practice at least portions of these regions will tend to merge together as a result of the implant processes and subsequent anneal processes performed on the device. Nevertheless, the drawings indicate these regions as being very precise and defined for purposes of explaining the present invention.

Through use of the angled implant process described herein, a doped region 57A is formed in the substrate adjacent the isolation structure 36 interface. See FIG. 5. As a result, semiconductor devices may be formed that exhibit lower leakage currents than prior art devices. This in turn will lead to devices with enhanced performance capability and the performance of integrated circuit devices comprised of such semiconductor devices.

The present invention is directed to a method of forming a transistor. In one illustrative embodiment, the method comprises providing a substrate 31 that is doped with a first type of dopant material, forming a transistor 30 above the substrate 31 in an active area 32 of the substrate 31 as defined by an isolation structure 36, and performing at least one ion implantation process 51, 55 to implant dopant atoms in the substrate 31 adjacent the gate electrode 40 of the transistor 30. The method further comprises performing at least two angled ion implant processes 57 on the transistor 30 with a dopant material that is of an opposite type to the first type of dopant material and performing at least one anneal process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a substrate, said substrate being doped with a first type of dopant material;
   forming a transistor above said substrate in an active area of said substrate as defined by an isolation structure, said transistor comprised of a gate electrode;
   performing a source/drain extension implant process at an angle that is approximately perpendicular to a surface of said substrate, said source/drain extension implant process being performed with a dopant material that is of an opposite type to said first type of dopant material;
   performing a source/drain implant process at an angle that is approximately perpendicular to a surface of said substrate, said source/drain implant process being performed with a dopant material that is of an opposite type to said first type of dopant material;
   performing at least two angled ion implant processes on said transistor with a dopant material that is of an opposite type to said first type of dopant material; and
   performing at least one anneal process.

2. The method of claim 1, wherein said substrate is doped with a P-type dopant material, and said at least two angled implant processes are performed using an N-type dopant material.

3. The method of claim 1, wherein said substrate is doped with an N-type dopant material, and said at least two angled implant processes are performed using a P-type dopant material.

4. The method of claim 1, wherein a first of said at least two angled implant processes is performed on a first side of said transistor, and a second of said at least two angled implant processes is performed on a second side of said transistor.

5. The method of claim 1, wherein each of said at least two angled implant processes are performed at an angle ranging from approximately 20–40 degrees, at a dopant concentration ranging from approximately $5 \times 10^{13}$ to $1 \times 10^{15}$ ions/cm$^2$, and at an energy level ranging from approximately 50–80 keV.

6. The method of claim 1, further comprising performing at least two additional angled ion implant processes using a dopant material that is of a type opposite to said first dopant material.

7. The method of claim 6, wherein each of said at least two additional angled implant processes are performed at an angle ranging from approximately 20–40 degrees, at a dopant concentration ranging from approximately $5 \times 10^{13}$ to $1 \times 10^{15}$ ions/cm$^2$, and at an energy level ranging from approximately 50–80 keV.

8. The method of claim 1, wherein said substrate is doped with a P-type dopant and each of said at least two angled implant processes are performed at an angle ranging from approximately 20–50 degrees using arsenic, at a dopant concentration ranging from approximately $5 \times 10^{13}$ to $1 \times 10^{15}$ ions/cm$^2$, and at an energy level ranging from approximately 50–80 keV.

9. The method of claim 1, wherein said substrate is doped with at least one of boron and boron difluoride, and said at least two angled implant processes are performed using at least one of arsenic and phosphorous.

10. The method of claim 1, wherein said substrate is doped with at least one of arsenic and phosphorous, and said at least two angled implant processes are performed using at least one of boron and boron difluoride.

11. The method of claim 1, wherein said at least two angled ion implant processes are performed after a sidewall spacer is formed adjacent said gate electrode.

12. The method of claim 1, wherein said at least two angled implant processes are performed prior to said source/drain implant process being performed on the transistor.

13. The method of claim 1, wherein said at least two angled implant processes are performed after said source/drain implant process has been performed on the transistor.

14. The method of claim 1, wherein performing at least one anneal process comprises performing at least one anneal process at a temperature ranging from approximately 1000–1050° C. for a duration ranging from approximately 5–20 seconds.

15. A method, comprising:
   providing a substrate, said substrate being doped with a first type of dopant material;
   forming a transistor above said substrate in an active area of said substrate as defined by an isolation structure, said transistor comprised of a gate electrode;
   performing a source/drain extension implant process at an angle that is approximately perpendicular to a surface of said substrate, said source/drain extension implant process being performed with a dopant material that is of an opposite type to said first type of dopant material;
   performing a source/drain implant process at an angle that is approximately perpendicular to a surface of said substrate, said source/drain implant process being performed with a dopant material that is of an opposite type to said first type of dopant material;
   performing at least two angled ion implant processes on said transistor with a dopant material that is of an opposite type to said first type of dopant material, said at least two angled ion implant processes being performed after a sidewall spacer is formed adjacent said gate electrode; and
   performing at least one anneal process.

16. The method of claim 15, wherein said substrate is doped with a P-type dopant material, and said at least two angled implant processes are performed using an N-type dopant material.

17. The method of claim 15, wherein said substrate is doped with an N-type dopant material, and said at least two angled implant processes are performed using a P-type dopant material.

18. The method of claim 15, wherein a first of said at least two angled implant processes is performed on a first side of said transistor, and a second of said at least two angled implant processes is performed on a second side of said transistor.

19. The method of claim 15, wherein each of said at least two angled implant processes are performed at an angle ranging from approximately 20–40 degrees, at a dopant concentration ranging from approximately $5 \times 10^{13}$ to $1 \times 10^{15}$ ions/cm$^2$, and at an energy level ranging from approximately 50–80 keV.

20. The method of claim 15, further comprising performing at least two additional angled ion implant processes using a dopant material that is of a type opposite to said first dopant material.

21. The method of claim 20, wherein each of said at least two additional angled implant processes are performed at an angle ranging from approximately 20–40 degrees, at a dopant concentration ranging from approximately $5 \times 10^{13}$ to $1 \times 10^{15}$ ions/cm$^2$, and at an energy level ranging from approximately 50–80 keV.

22. The method of claim 15, wherein said substrate is doped with a P-type dopant and each of said at least two angled implant processes are performed at an angle ranging from approximately 20–50 degrees using arsenic, at a dopant concentration ranging from approximately $5 \times 10^{13}$ to $1 \times 10^{15}$ ions/cm$^2$, and at an energy level ranging from approximately 50–80 keV.

23. The method of claim 15, wherein said substrate is doped with at least one of boron and boron difluoride, and said at least two angled implant processes are performed using at least one of arsenic and phosphorous.

24. The method of claim 15, wherein said substrate is doped with at least one of arsenic and phosphorous, and said at least two angled implant processes are performed using at least one of boron and boron difluoride.

25. The method of claim 15, wherein said at least two angled implant processes are performed prior to said source/drain implant process being performed on the transistor.

26. The method of claim 15, wherein said at least two angled implant processes are performed after said source/drain implant process has been performed on the transistor.

27. The method of claim 15, wherein performing at least one anneal process comprises performing at least one anneal process at a temperature ranging from approximately 1000–1050° C. for a duration ranging from approximately 5–20 seconds.

28. A method, comprising:
providing a substrate, said substrate being doped with a first type of dopant material;
forming a transistor above said substrate in an active area of said substrate as defined by an isolation structure, said transistor comprised of a gate electrode;
performing a source/drain extension implant process at an angle that is approximately perpendicular to a surface of said substrate, said source/drain extension implant process being performed with a dopant material that is of an opposite type to said first type of dopant material;
performing a source/drain implant process at an angle that is approximately perpendicular to a surface of said substrate, said source/drain implant process being performed with a dopant material that is of an opposite type to said first type of dopant material;
performing at least four angled ion implant processes on said transistor with a dopant material that is of an opposite type to said first type of dopant material; and
performing at least one anneal process.

29. The method of claim 28, wherein said substrate is doped with a P-type dopant material, and said at least four angled implant processes are performed using an N-type dopant material.

30. The method of claim 28, wherein said substrate is doped with an N-type dopant material, and said at least four angled implant processes are performed using a P-type dopant material.

31. The method of claim 28, wherein performing at least one ion implant process to implant dopant atoms in said substrate adjacent said gate electrode comprises performing at least one ion implant process to implant dopant atoms that are of an opposite type to said first type of dopant material.

32. The method of claim 28, wherein said at least four angled implant processes are performed approximately 90 degrees relative to one another.

33. The method of claim 28, wherein each of said at least four angled implant processes are performed at an angle ranging from approximately 20–40 degrees, at a dopant concentration ranging from approximately $5 \times 10^{13}$ to $1 \times 10^{15}$ ions/cm$^2$, and at an energy level ranging from approximately 50–80 keV.

34. The method of claim 28, wherein said substrate is doped with a P-type dopant and each of said at least four angled implant processes are performed at an angle ranging from approximately 20–50 degrees using arsenic, at a dopant concentration ranging from approximately $5 \times 10^{13}$ to $1 \times 10^{15}$ ions/cm$^2$, and at an energy level ranging from approximately 50–80 keV.

35. The method of claim 28, wherein said substrate is doped with at least one of boron and boron difluoride, and said at least four angled implant processes are performed using at least one of arsenic and phosphorous.

36. The method of claim 28, wherein said substrate is doped with at least one of arsenic and phosphorous, and said at least four angled implant processes are performed using at least one of boron and boron difluoride.

37. The method of claim 28, wherein said at least four angled ion implant processes are performed after a sidewall spacer is formed adjacent said gate electrode.

38. The method of claim 28, wherein said at least four angled implant processes are performed prior to said source/drain implant process being performed on the transistor.

39. The method of claim 28, wherein said at least four angled implant processes are performed after said source/drain implant process has been performed on the transistor.

40. The method of claim 28, wherein performing at least one anneal process comprises performing at least one anneal process at a temperature ranging from approximately 1000–1050° C. for a duration ranging from approximately 5–20 seconds.

* * * * *